US012631673B2

(12) United States Patent
Murakami et al.

(10) Patent No.: US 12,631,673 B2
(45) Date of Patent: May 19, 2026

(54) MEASUREMENT APPARATUS AND MEASUREMENT METHOD

(71) Applicants: Yokogawa Electric Corporation, Musashino (JP); Yokogawa Test & Measurement Corporation, Hachioji (JP)

(72) Inventors: Kenji Murakami, Hachioji (JP); Naoki Ito, Hachioji (JP)

(73) Assignees: Yokogawa Electric Corporation, Tokyo (JP); Yokogawa Test & Measurement Corporation, Tokyo (JP)

( * ) Notice: Subject to any disclaimer, the term of this patent is extended or adjusted under 35 U.S.C. 154(b) by 201 days.

(21) Appl. No.: 18/655,728

(22) Filed: May 6, 2024

(65) Prior Publication Data

US 2024/0385229 A1 Nov. 21, 2024

(30) Foreign Application Priority Data

May 18, 2023 (JP) ................................ 2023-082535

(51) Int. Cl.
| | |
|---|---|
| *G01R 21/06* | (2006.01) |
| *G01R 19/00* | (2006.01) |
| *G01R 21/133* | (2006.01) |
| *G01R 31/52* | (2020.01) |

(52) U.S. Cl.
CPC ............. *G01R 21/06* (2013.01); *G01R 31/52* (2020.01); *G01R 19/00* (2013.01); *G01R 21/1331* (2013.01)

(58) Field of Classification Search
CPC ... G01R 1/00; G01R 1/20; G01R 1/22; G01R 15/00; G01R 15/14; G01R 15/16; G01R 19/00; G01R 19/0084; G01R 19/0092; G01R 21/00; G01R 21/20; G01R 21/22; G01R 31/00; G01R 31/50; G01R 31/52
USPC ........................................... 324/76.11, 140 R
See application file for complete search history.

(56) References Cited

U.S. PATENT DOCUMENTS 9,382,898 B2 * 7/2016 Teodorescu ............... H02J 3/01

FOREIGN PATENT DOCUMENTS

| | | | | | |
|---|---|---|---|---|---|
| CN | 204116839 U | * | 1/2015 | ............. | G05B 19/04 |
| CN | 109004684 A | * | 12/2018 | ............. | H02J 3/386 |
| JP | 4251961 B2 | | 4/2009 | | |

* cited by examiner

*Primary Examiner* — Hoai-An D. Nguyen
(74) *Attorney, Agent, or Firm* — WHDA, LLP

(57) ABSTRACT

A measurement apparatus includes a controller configured to inject an injection current with a second frequency through an insulator into the core wire, to which the voltage to be measured, with a first frequency, is applied, acquire a composite current in which the injection current and a leakage current of the voltage to be measured having leaked out of the core wire through the insulator are superimposed in a circuit unit, calculate, by analyzing the composite current, measured active and reactive powers equivalent to active and reactive powers based on a contribution of the voltage to be measured, calculate the voltage to be measured, based on the measured active and reactive powers, the first and second frequencies, a voltage of the injection current, and a current effective value of the leakage current, and output the calculated voltage to be measured.

10 Claims, 7 Drawing Sheets

MEASUREMENT APPARATUS AND MEASUREMENT METHOD

CROSS-REFERENCE TO RELATED APPLICATION

This application claims priority to Japanese Patent Application No. 2023-082535, filed on May 18, 2023, the entire contents of which are incorporated herein by reference.

TECHNICAL FIELD

The present disclosure relates to a measurement apparatus and a measurement method.

BACKGROUND

With the development of 24-hour operation, systemization, and the like of equipment, there is a growing demand for maintenance while the equipment is still in operation. As part of such equipment maintenance, metal clips are connected to screws or other parts, which constitute live wire sections, in switchboards or the like to measure the voltage, phase, and the like of the live wire sections.

The live wire sections of the switchboards do not have a structure for clipping, and are often dense in small areas. Therefore, the method of connecting a clip to a live wire section and measuring a voltage or the like may cause a risk of electric shock to an operator. There may also be risks of a short circuit in a power supply at the time of clipping, a short circuit due to the clip falling off, a loss of measurement data due to the clip falling off, and the like.

Patent Literature (PTL) 1 describes a non-contact voltage measurement apparatus that measures an alternating voltage, which is applied to a core wire of an electric wire, through an insulator in contact with the core wire. In the configuration of PTL 1, a coupling capacitance is obtained based on an input signal, which is divided between the insulator and the coupling capacitance between electrodes, by varying the capacitance of a reference capacitor provided in advance, and the alternating voltage is measured based on the value of this coupling capacitance. According to this configuration, the voltage to be measured applied to the core wire, or the like can be measured from over a cable sheath, not from a live wire section. Therefore, the risks of electric shock to an operator, a short circuit, a loss of measurement data, and the like can be reduced.

CITATION LIST

Patent Literature

PTL 1: JP 4251961 B2

SUMMARY

A measurement apparatus according to some embodiments includes a controller configured to:

inject an injection current with a second frequency into a core wire through an insulator, a voltage to be measured, with a first frequency, being applied to the core wire;

acquire a composite current that is composed of the injection current and a leakage current of the voltage to be measured having leaked through the insulator;

calculate a measured active power and a measured reactive power based on the composite current, the measured active power and the measured reactive power being equivalent to an active power and a reactive power based on a contribution of the voltage to be measured;

calculate the voltage to be measured, based on the measured active power, the measured reactive power, the first frequency, the second frequency, a voltage of the injection current, and a current effective value of the leakage current; and output the voltage to be measured.

A measurement method according to some embodiments is a measurement method by a measurement apparatus including a controller, the measurement method including:

injecting, by the controller, an injection current with a second frequency into a core wire through an insulator, a voltage to be measured, with a first frequency, being applied to the core wire;

acquiring, by the controller, a composite current that is composed of the injection current and a leakage current of the voltage to be measured having leaked through the insulator;

calculating, by the controller, a measured active power and a measured reactive power based on the composite current, the measured active power and the measured reactive power being equivalent to an active power and a reactive power based on a contribution of the voltage to be measured;

calculating, by the controller, the voltage to be measured, based on the measured active power, the measured reactive power, the first frequency, the second frequency, a voltage of the injection current, and a current effective value of the leakage current; and outputting, by the controller, the voltage to be measured.

DETAILED DESCRIPTION

Figure 1:
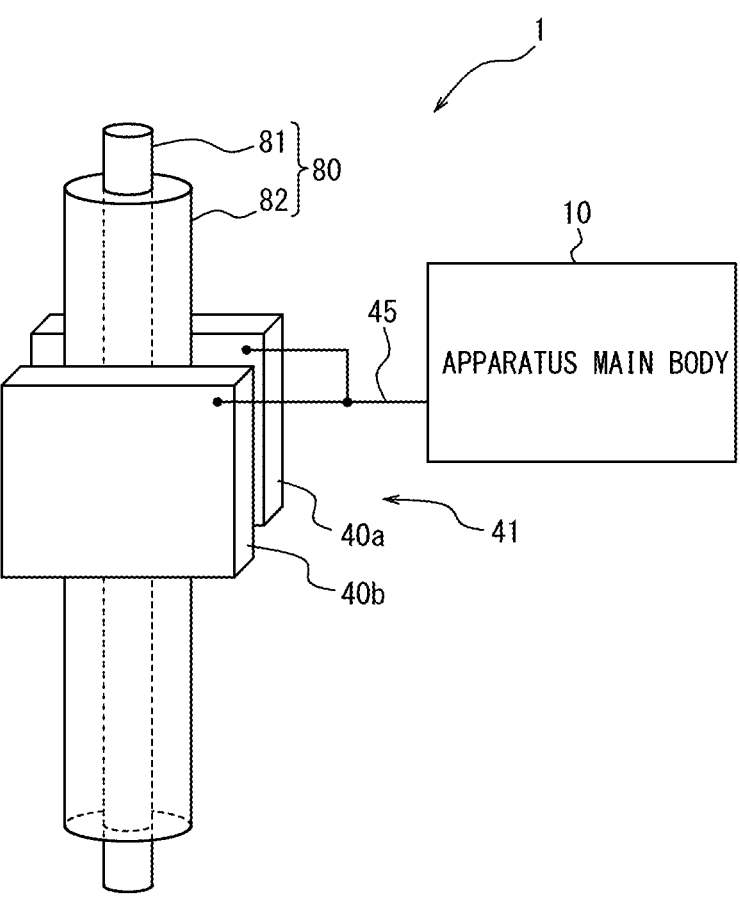
FIG. 1 is a diagram illustrating an example of the configuration of a measurement apparatus according to an embodiment.

The configuration of PTL 1 leaves room for improvement in measurement accuracy in measuring an applied voltage or the like through an insulator in contact with a core wire of a sheathed electric wire.

It would be helpful to enable measurement of a physical quantity of a voltage to be measured applied to a core wire, from over a cable sheath with higher accuracy.

A measurement apparatus according to some embodiments includes (1) a controller configured to:

inject an injection current with a second frequency into a core wire through an insulator, a voltage to be measured, with a first frequency, being applied to the core wire;

acquire a composite current that is composed of the injection current and a leakage current of the voltage to be measured having leaked through the insulator;

calculate a measured active power and a measured reactive power based on the composite current, the measured active power and the measured reactive power being equivalent to an active power and a reactive power based on a contribution of the voltage to be measured;

calculate the voltage to be measured, based on the measured active power, the measured reactive power, the first frequency, the second frequency, a voltage of the injection current, and a current effective value of the leakage current; and output the voltage to be measured.

Thus, the measurement apparatus measures, based on the signal acquired through the insulator, the leakage current flowing, through the sheath, out of the core wire to which the voltage to be measured is applied, rather than acquiring a signal directly from the core wire to which the voltage to be measured is applied, thus enabling measurement of a physical quantity of the voltage to be measured from over the cable sheath. The measurement apparatus injects the injection current with the second frequency different from the first frequency of the leakage current flowing, through the sheath, out of the core wire to which the voltage to be measured is applied, and measures the voltage to be measured, based on the active power and the reactive power based on the contribution of the voltage to be measured. Therefore, the measurement apparatus can measure the voltage to be measured, from over the cable sheath with higher accuracy with a simple configuration by distinguishing, based on the frequencies, the leakage current flowing, through the sheath, out of the core wire to which the voltage to be measured is applied, from the injection current, while the cable is in a live wire condition.

According to one embodiment, (2) in the measurement apparatus according to (1), the controller may be configured to:

calculate an apparent power based on the measured active power, the measured reactive power, the first frequency, and the second frequency, the apparent power corresponding to the measured active power and the measured reactive power; and calculate the voltage to be measured, based on the calculated apparent power, the voltage of the injection current, and the current effective value of the leakage current.

Thus, the measurement apparatus calculates the apparent power corresponding to the measured active power and the measured reactive power, and calculates the voltage to be measured, thus enabling measurement of the voltage to be measured with higher accuracy according to a resistance component and a capacitance component of the insulator.

According to one embodiment, (3) in the measurement apparatus according to (1) or (2), the controller may be configured to:

calculate a phase of the leakage current, relative to the injection current, based on the ratio between the calculated measured active power and the calculated measured reactive power; and further output the calculated phase of the leakage current.

Thus, the measurement apparatus can measure, with higher accuracy, not only the voltage to be measured but also the phase of the leakage current having leaked through the insulator due to the voltage to be measured.

According to one embodiment, (4) in the measurement apparatus according to any one of (1) to (3), the controller may be configured to:

measure an injection active power and an injection reactive power equivalent to an active power and a reactive power in a circuit unit that are measured with a contribution of the leakage current with application of the injection current in the circuit unit;

measure an offset active power and an offset reactive power equivalent to an active power and a reactive power in the circuit unit that are measured without a contribution of the leakage current with application of the injection current in the circuit unit;

calculate, as the measured active power, a power in which the offset active power is offset from the injection active power; and calculate, as the measured reactive power, a power in which the offset reactive power is offset from the injection reactive power.

Thus, the measurement apparatus measures the measured active power and the measured reactive power by offsetting the offset active power and the offset reactive power, which are measured without the contribution of the leakage current, from the injection active power and the injection reactive power, and measures the voltage to be measured, using the measured active power and the measured reactive power. Therefore, the measurement apparatus can measure a physical quantity of the voltage to be measured with higher accuracy, with reduced influences of measurement environment, internal leakages, and the like.

According to one embodiment, (5) in the measurement apparatus according to any one of (1) to (4), the controller may be configured to:

acquire a voltage of the leakage current of the voltage to be measured that has leaked out of the core wire through the insulator without a contribution of the injection current; and acquire the current effective value of the leakage current, based on the acquired voltage of the leakage current.

Thus, the measurement apparatus acquires the current effective value, based on the measurement value of the leakage current measured without the contribution of the injection current. Therefore, the measurement apparatus can measure a physical quantity of the voltage to be measured with higher accuracy, using the more accurate current effective value.

A measurement method according to some embodiments is (6) a measurement method by a measurement apparatus including a controller, the measurement method including:

injecting, by the controller, an injection current with a second frequency into a core wire through an insulator, a voltage to be measured, with a first frequency, being applied to the core wire;

acquiring, by the controller, a composite current that is composed of the injection current and a leakage current of the voltage to be measured having leaked through the insulator;

calculating, by the controller, a measured active power and a measured reactive power based on the composite current, the measured active power and the measured reactive power being equivalent to an active power and a reactive power based on a contribution of the voltage to be measured;

calculating, by the controller, the voltage to be measured, based on the measured active power, the measured reactive power, the first frequency, the second frequency, a voltage of the injection current, and a current effective value of the leakage current; and outputting, by the controller, the voltage to be measured.

Thus, the measurement method measures, based on the signal acquired through the insulator, the leakage current flowing, through the sheath, out of the core wire to which the voltage to be measured is applied, rather than acquiring a signal directly from the core wire to which the voltage to be measured is applied, thus enabling measurement of a physical quantity of the voltage to be measured from over the cable sheath. The measurement method injects the injection current with the second frequency different from the first frequency of the leakage current flowing, through the sheath, out of the core wire to which the voltage to be measured is applied, and measures the voltage to be measured, based on the active power and the reactive power based on the contribution of the voltage to be measured. Therefore, the measurement method can measure the voltage to be measured, from over the cable sheath with higher accuracy with a simple configuration by distinguishing, based on the frequencies, the leakage current flowing, through the sheath, out of the core wire to which the voltage to be measured is applied, from the injection current, while the cable is in a live wire condition.

According to one embodiment, (7) the measurement method according to (6), may include:

calculating, by the controller, an apparent power based on the measured active power, the measured reactive power, the first frequency, and the second frequency, the apparent power corresponding to the measured active power and the measured reactive power; and calculating, by the controller, the voltage to be measured, based on the calculated apparent power, the voltage of the injection current, and the current effective value of the leakage current.

Thus, the measurement method calculates the apparent power corresponding to the measured active power and the measured reactive power, and calculates the voltage to be measured, thus enabling measurement of the voltage to be measured with higher accuracy according to a resistance component and a capacitance component of the insulator.

According to one embodiment, (8) the measurement method according to (6) or (7), may include:

calculating, by the controller, a phase of the leakage current, relative to the injection current, based on the ratio between the calculated measured active power and the calculated measured reactive power; and further outputting, by the controller, the calculated phase of the leakage current.

Thus, the measurement method can measure, with higher accuracy, not only the voltage to be measured but also the phase of the leakage current having leaked through the insulator due to the voltage to be measured.

According to one embodiment, (9) the measurement method according to any one of (6) to (8), may include:

measuring, by the controller, an injection active power and an injection reactive power equivalent to an active power and a reactive power in a circuit unit that are measured with a contribution of the leakage current with application of the injection current in the circuit unit;

measuring, by the controller, an offset active power and an offset reactive power equivalent to an active power and a reactive power in the circuit unit that are measured without a contribution of the leakage current with application of the injection current in the circuit unit;

calculating, by the controller, as the measured active power, a power in which the offset active power is offset from the injection active power; and calculating, by the controller, as the measured reactive power, a power in which the offset reactive power is offset from the injection reactive power.

Thus, the measurement method measures the measured active power and the measured reactive power by offsetting the offset active power and the offset reactive power, which are measured without the contribution of the leakage current, from the injection active power and the injection reactive power, and measures the voltage to be measured, using the measured active power and the measured reactive power. Therefore, the measurement method can measure a physical quantity of the voltage to be measured with higher accuracy, with reduced influences of measurement environment, internal leakages, and the like.

According to one embodiment,

(10) the measurement method according to any one of (6) to (9), may include:

acquiring, by the controller, a voltage of the leakage current of the voltage to be measured that has leaked out of the core wire through the insulator without a contribution of the injection current; and acquiring, by the controller, the current effective value of the leakage current, based on the acquired voltage of the leakage current.

Thus, the measurement method acquires the current effective value, based on the measurement value of the leakage current measured without the contribution of the injection current. Therefore, the measurement method can measure a physical quantity of the voltage to be measured with higher accuracy, using the more accurate current effective value.

According to the present disclosure, a physical quantity of a voltage to be measured applied to a core wire can be measured from over a cable sheath with higher accuracy.

Comparative Example

As a configuration according to a comparative example, PTL 1 (claim 1) states

"A non-contact voltage measurement apparatus configured to measure an alternating voltage, which is applied to a core wire of an electric wire, through an insulator in contact with the core wire, the non-contact voltage measurement apparatus including:

a first electrode configured to capture an input signal through the insulator;

a voltage measurement means configured to obtain a coupling capacitance between electrodes, based on the input signal divided between the insulator and the coupling capacitance by varying the capacitance of a reference capacitor provided in advance, and obtain the alternating voltage based on the value of the coupling capacitance;

a second electrode configured to detect, through the insulator, an alternating voltage that has the same phase as the alternating voltage, the second electrode being disposed a small distance away from the electric wire so as to be coupled to the electric wire only by a capacitance component and not to contact with a resistance component;

a phase difference detection means configured to detect the phase difference between the alternating voltage obtained by the voltage measurement means and the alternating voltage obtained by the second electrode; and a correction means configured to correct the alternating current obtained by the voltage measurement means by input of the phase difference obtained by the phase difference detection means and the voltage from the voltage measurement means."

The capacitance of the insulator that sheathes the electric wire is extremely small and may vary greatly depending on measurement conditions such as temperature and humidity. Therefore, the configuration of the comparative example, which measures the alternating voltage based on the capacitance of the insulator, has room for improvement in measurement accuracy.

Embodiment

An embodiment of the present disclosure will be described below with reference to the drawings. In the drawings, portions having the same configuration or function are denoted by the same reference numerals. In the description of this embodiment, duplicate descriptions of the same portions may be omitted or simplified as appropriate.

FIG. 1 is a diagram illustrating an example of the configuration of a measurement apparatus 1 according to the embodiment. The measurement apparatus 1 measures a voltage $V_M$ to be measured applied to a cable 80, and the phase $\theta_M$ of a leakage current $I_M$ flowing out through a sheath. The cable 80 includes a core wire 81, to which the voltage $V_M$ to be measured is applied, and a cable sheath 82, which is an insulator sheathing the core wire 81. The measurement apparatus 1 includes an apparatus main body 10, an insulation clip 41, and wiring 45.

The insulation clip 41 contacts the cable sheath 82, and acquires the current $I_M$ (current effective value of leakage current: $I_M$) flowing out through the sheath from the core wire 81 to which the voltage $V_M$ to be measured is applied. As illustrated in FIG. 1, the insulation clip 41 contacts the cable sheath 82 of the cable 80 by a pair of clip electrodes 40a and 40b, which sandwich the cable sheath 82. The clip electrodes 40a and 40b may be hereinafter referred to collectively as "clip electrodes 40".

Figure 2:
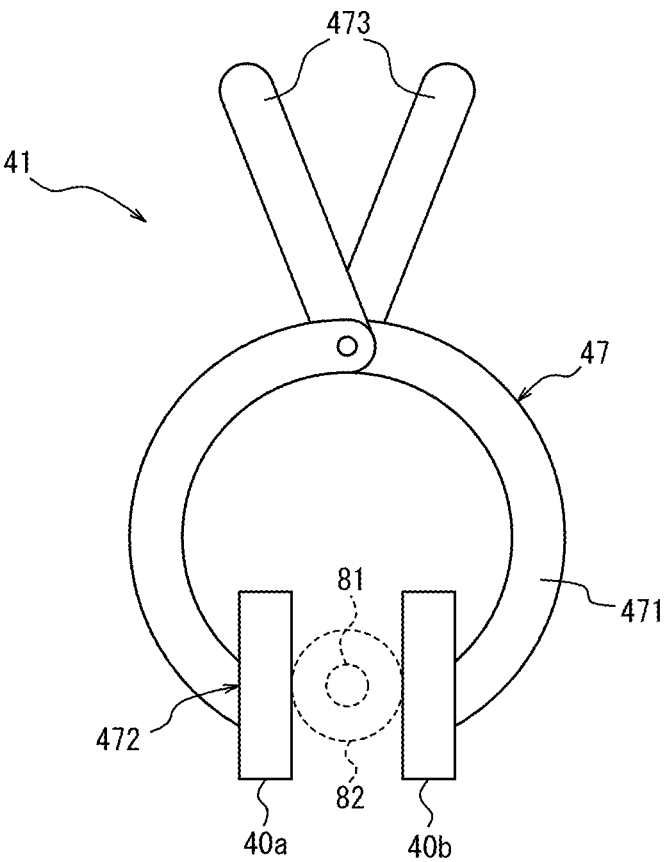
FIG. 2 is a diagram illustrating an example of the configuration of a gripping structure provided in an insulation clip of FIG. 1.

The insulation clip 41 may be provided with a gripping structure 47 that presses the clip electrodes 40 of FIG. 1 against the cable 80. FIG. 2 is a diagram illustrating an example of the configuration of the gripping structure 47 provided in the insulation clip 41 of FIG. 1. The gripping structure 47 is provided with an arm portion 471, contact portions 472, and a gripping portion 473. The gripping structure 47 presses the pair of clip electrodes 40a and 40b against the cable sheath 82 by the arm portion 471 using an elastic force of a leaf spring or the like. In this embodiment, the contact portions 472, which are ends of the arm portion 471, are connected to the clip electrodes 40a and 40b via adhesive portions 408 (see FIG. 3). The gripping portion 473 is manipulated by an operator to widen the length between the clip electrodes 40a and 40b.

Figure 3:
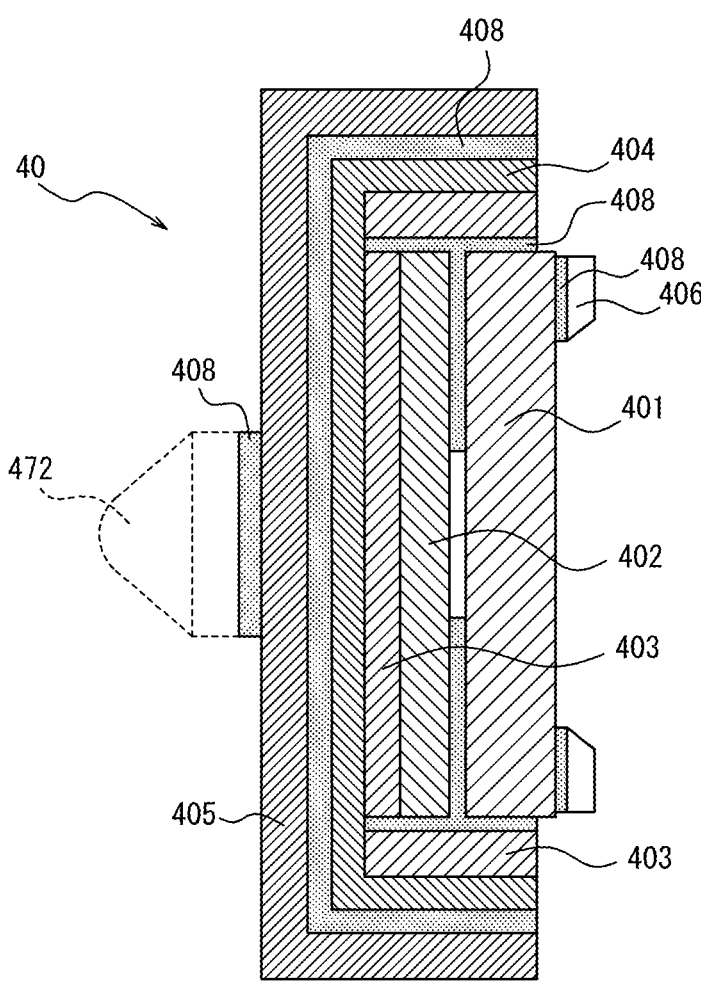
FIG. 3 is a cross-sectional view illustrating an example of the configuration of a clip electrode of FIG. 2.

The clip electrode 40 has an electrode 402 that acquires electrical signals from the cable sheath 82 through an insulator portion 401. FIG. 3 is a cross-sectional view illustrating an example of the configuration of the clip electrode 40 of FIG. 2. The clip electrode 40 includes the insulator portion 401, the electrode 402, insulator portions 403, a shield 404, insulator portions 405 and 406, and adhesive portions 408.

The insulator portion 401 is an insulator in contact with the cable sheath 82 of the cable 80. The insulator portion 401 may be composed of, for example, rubber including ethylene propylene rubber, or the like. The electrode 402 is a conductor that acquires the electrical signals from the cable sheath 82 through the insulator portion 401. The electrode 402 outputs the electrical signals acquired from the cable sheath 82 to the apparatus main body 10 via the wiring 45.

The insulator portions 403 are insulators that cover the periphery of the electrode 402 to prevent a short circuit. The shield 404 is a conductor that covers the electrode 402 over the insulator portions 403 to suppress the influences of external electromagnetic fields, external electromagnetic waves, and the like. The insulator portion 405 is an insulator that constitutes a housing of the clip electrode 40. The insulator portions 406 are insulators that prevent the cable 80 from moving relative to the insulator portion 401. The insulator portions 406 may be provided as projections on edges of the insulator portion 401. The insulator portions 403, 405, and 406 may be composed of a resin including acrylic, for example.

The insulator portion 401, the electrode 402, the insulator portions 403, the shield 404, and the insulator portions 405 and 406 are adhered to each other by the adhesive portions 408. The adhesive portions 408 may be composed of, for example, an adhesive (binder) having insulating properties.

In the example of FIGS. 2 and 3, the contact portion 472 of the gripping structure 47 is secured to an outer surface of the insulator portion 405 by the adhesive portion 408. Thus, the operator can manipulate the gripping portion 473 to widen the length between the clip electrodes 40a and 40b, attach the insulation clip 41 to the cable 80, and remove the insulation clip 41 from the cable 80.

Figure 4:
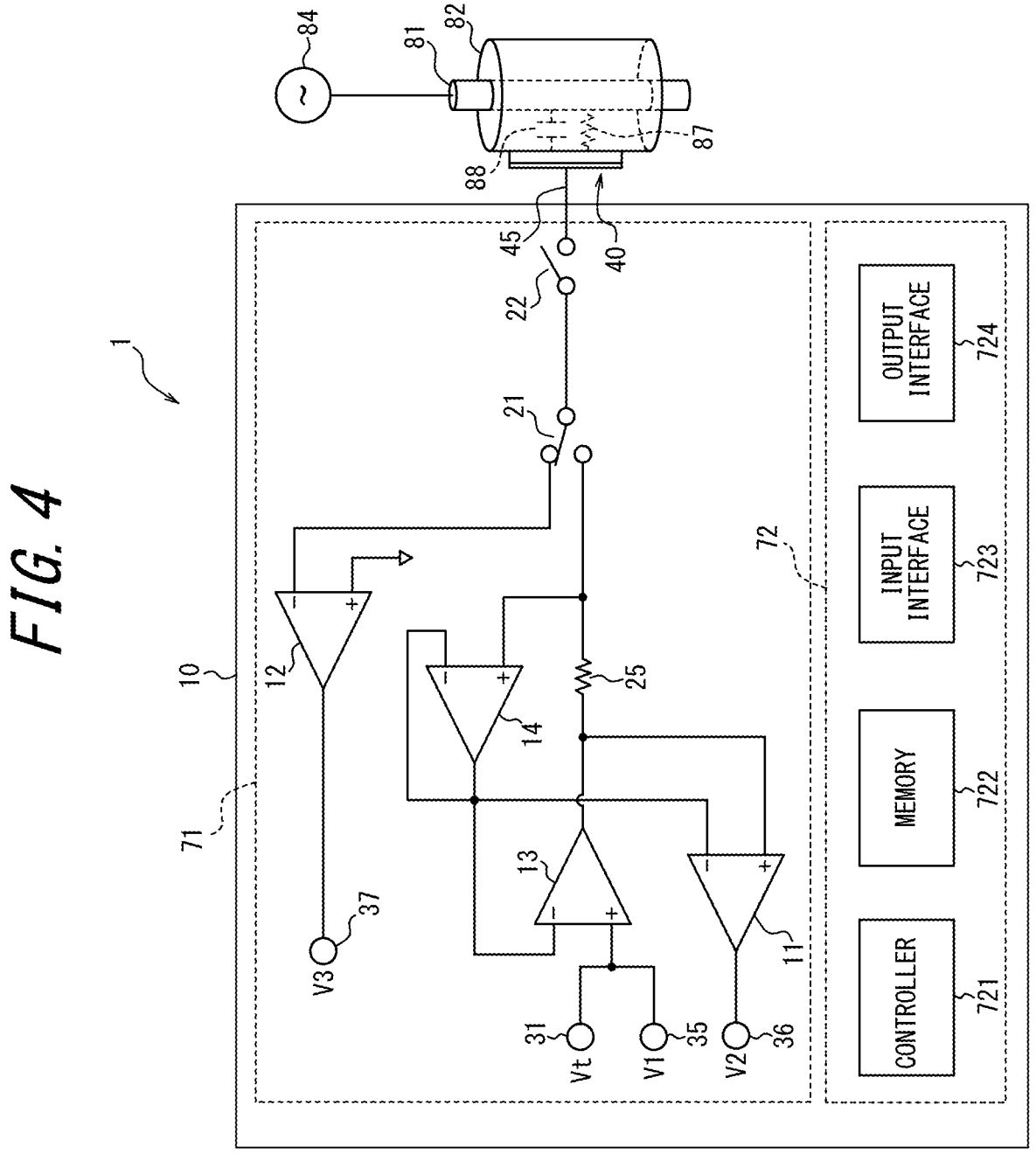
FIG. 4 is a diagram illustrating an example of the configuration of the measurement apparatus, which includes circuitry of an apparatus main body of FIG. 1.

FIG. 4 is a diagram illustrating an example of the configuration of the measurement apparatus 1, which includes circuitry of the apparatus main body 10 of FIG. 1. As illustrated in FIG. 4, the apparatus main body 10 includes a circuit unit 71 and a control unit 72. The circuit unit 71 outputs electrical signals to the cable 80 and acquires responses from the cable 80. The control unit 72 controls operations of the circuit unit 71 and provides interfaces with the operator.

The circuit unit 71 includes operational amplifiers 11 to 14, switches 21 and 22, a resistor 25, an injection terminal 31, and measurement terminals 35 to 37.

The operational amplifiers 11 to 14 are electronic circuit modules of amplifiers with a non-inverting input terminal (+), an inverting input terminal (−), and an output terminal. The operational amplifiers 11 to 14 each amplify the potential difference between the non-inverting input terminal and the inverting input terminal at a specified amplification ratio (gain) and output the amplified potential difference from the output terminal. The operational amplifier 11 has a non-inverting input terminal connected to an output terminal of the operational amplifier 13 and the resistor 25, an inverting input terminal connected to an output terminal of the operational amplifier 14, and an output terminal connected to the measurement terminal 36. The operational amplifier 12 (I/V amplifier) has a non-inverting input terminal connected to the ground (GND), an inverting input terminal connected to the switch 21, and an output terminal connected to the measurement terminal 37. The operational amplifier 13 has a non-inverting input terminal connected to the injection terminal 31 and the measurement terminal 35, an inverting input terminal connected to the output terminal of the operational amplifier 14, and an output terminal connected to the non-inverting input terminal of the operational amplifier 11 and the resistor 25. The operational amplifier 14 (buffer amplifier) has a non-inverting input terminal connected to the switch 21 and the resistor 25, an inverting input terminal connected to the output terminal of the operational amplifier 14, and an output terminal connected to the inverting input terminal of each of the operational amplifiers 11, 13 and 14.

The switch 21 is connected to the switch 22 at one end. The switch 21 connects either the inverting input terminal of the operational amplifier 12 or the non-inverting input terminal of the operational amplifier 14 and the resistor 25, to the switch 22 by a switching operation. The switch 22 is connected to the switch 21 at one end and to the clip electrode 40 at the other end. The switch 22 connects or opens between the switch 21 and the clip electrode 40 by a switching operation. The resistor 25 has a resistance value of $R_x$.

The injection terminal 31 outputs an injection current to the non-inverting input terminal of the operational amplifier 13. The injection current is an alternating current signal with a voltage $V_t$ and a frequency $F_t$ (second frequency).

The measurement terminals 35 to 37 output measurement signals $V_1$ to $V_3$. The measurement signal $V_1$ output by the measurement terminal 35 is the same as the voltage $V_t$ of the injection current output by the injection terminal 31. The measurement signal $V_2$ output by the measurement terminal 36 is a current output from the output terminal of the operational amplifier 11. When the switch 21 is connected to the resistor 25 side and the switch 22 is connected, the measurement signal $V_2$ corresponds to a composite current in which the injection current is superimposed on a leakage current of the voltage $V_M$ to be measured. When the switch 22 is open, the measurement signal $V_2$ corresponds to a current flowing in the circuit unit 71 due to injection of the injection current into the circuit unit 71. The measurement signal $V_3$ output by the measurement terminal 37 is a current output from the output terminal of the operational amplifier 12. When the switch 21 is connected to the operational amplifier 12 side, the measurement signal $V_3$ corresponds to the voltage $V_M$ of the leakage current, which has leaked out of the core wire 81 through the cable sheath 82 and the insulator portion 401.

The control unit 72 includes a controller 721, a memory 722, an input interface 723, and an output interface 724.

The controller 721 includes one or more processors. The controller 721 is communicatively connected to each of components constituting the apparatus main body 10, and controls operations of the entire measurement apparatus 1. For example, the controller 721 may control switching of the switches 21 and 22, input of the injection current from the injection terminal 31, voltage measurement at the measurement terminals 35 to 37, analysis of voltage measurement values, and the like.

The memory 722 includes one or more memory devices. The memory 722 stores any information used in the operations of the measurement apparatus 1. For example, the measurement apparatus 1 may store information regarding measurement of the voltage $V_M$ to be measured applied to the core wire 81.

The input interface 723 includes one or more input interfaces that accept input operations by the operator and acquire input information based on the operations by the operator. For example, the input interface 723 includes a physical key, a capacitive key, a touch screen integrated with a display of the output interface 724, and the like, but is not limited to these.

The output interface 724 includes one or more output interfaces that output information to the operator and notify the operator of the information. For example, the output interface 724 is a display that outputs information as images, or the like, but is not limited to this.

In this embodiment, the apparatus main body 10 includes the circuit unit 71 and the control unit 72, but some of functions thereof may be realized by an external apparatus.

For the sake of simplicity of explanation, an example in which the apparatus main body 10 measures the voltage $V_M$ to be measured applied to the core wire 81 and the phase $\theta_M$ of the leakage current, based on an electrical signal acquired from one clip electrode 40 will be described below. When electrical signals are received from a plurality of clip electrodes 40, as illustrated in FIGS. 1 and 2, the measurement apparatus 1 can measure the voltage $V_M$ to be measured and the phase $\theta_M$ of the leakage current for each clip electrode 40 by providing the circuit unit 71 for each clip electrode 40.

In the example in FIG. 4, the voltage $V_M$ to be measured is applied from a power supply 84 to the core wire 81. The voltage $V_M$ to be measured is an alternating current signal with a frequency $F_M$ (first frequency), the voltage $V_M$, and the phase $\theta_M$. When the clip electrode 40 is brought into contact with the cable sheath 82, the leakage current $I_M$ (current effective value: $I_M$) of the voltage $V_M$ to be measured leaks out to the clip electrode 40 through a resistance component 87 and a capacitance component 88 of the cable sheath 82. Here, the resistance component 87 and the capacitance component 88 of the cable sheath 82 also include a contribution of a resistance component and a capacitance component of the insulator portion 401. Operations of the measurement apparatus 1 to measure the voltage $V_M$ to be measured and the phase $\theta_M$ of the leakage current when the frequency $F_M$ of the voltage $V_M$ to be measured is known will be described below. For the sake of simplicity of explanation, a description of operations regarding the gains of the operational amplifiers 11 to 14 is omitted below.

The measurement apparatus 1 connects the switch 21 to the resistor 25 side and also connects the switch 22. In this state, the measurement apparatus 1 applies the injection current (for example, $V_t=8$ V, $F_t=40$ Hz) from the injection terminal 31. In this case, a composite current, which is a combination of a current flowing out of the circuit unit 71 to the cable sheath 82 due to the injection current and the leakage current $I_M$ of the voltage $V_M$ to be measured that has leaked out of the core wire 81 to the circuit unit 71 through the cable sheath 82, flows through the resistor 25 (for example, Rx=1 to 10 MΩ). The measurement terminal 36 outputs the measurement signal $V_2$ with a voltage $V_2$ proportional to the magnitude of such a composite current. The measurement terminal 35 outputs the measurement signal $V_1$ that is the same as the voltage $V_t$ of the injection current. The measurement apparatus 1 then calculates, based on the voltages $V_1$ and $V_2$, an injection active power Ix_Active, which is equivalent to an active power of the composite current, and an injection reactive power Ix_Reactive, which is equivalent to a reactive power of the composite current. The measurement apparatus 1 can determine the phase $\theta_M$ of the leakage current relative to the injection current, based on the ratio between the injection active power Ix_Active and the injection reactive power Ix_Reactive. The phase $\theta_M$ corresponds to the phase of the voltage $V_M$ to be measured, relative to the voltage $V_t$ caused by the injection current.

The phase difference between the voltage $V_1$ of the applied injection current and the voltage $V_2$ of the composite current varies depending on the ratio between the resistance component 87 and the capacitance component 88 of the cable sheath 82 (including the insulator portion 401). Therefore, the measurement apparatus 1 can measure the resistance component 87 and the capacitance component 88 of the cable sheath 82 (including the insulator portion 401) based on the injection active power Ix_Active and the injection reactive power Ix_Reactive. Furthermore, since the voltage $V_2$ is a voltage corresponding to the composite current, the measurement apparatus 1 can extract only the leakage current $I_M$ of the voltage $V_M$ to be measured, by comparing the waveform of the voltage $V_2$ with the waveform of the voltage $V_1 (=V_t)$. The frequency $F_t$ of the voltage $V_t$ of the injection current and the frequency $F_M$ of the voltage $V_M$ to be measured are known. Therefore, the measurement apparatus 1 can calculate the voltage $V_M$ to be measured using this information.

As described above, theoretically, the measurement apparatus 1 can measure the voltage $V_M$ to be measured and the phase $\theta_M$ of the leakage current. In practice, however, there are influences of measurement environment, such as temperature and humidity, as well as a capacitive leakage and a resistive leakage in the circuit unit 71, and these contributions may cause errors in the measurement values. Therefore, the measurement apparatus 1 may measure the measurement signal $V_1$ at the measurement terminal 35 and the measurement signal $V_2$ at the measurement terminal 36 when the switch 21 is connected to the resistor 25 side and the switch 22 is open. The measurement apparatus 1 may calculate an offset active power Iofs_Active, which is equivalent to an active power of the voltage $V_2$ when the influence of the voltage $V_M$ to be measured is excluded, and an offset reactive power Iofs_Reactive, which is equivalent to a reactive power thereof. The measurement apparatus 1 may calculate an active power I_Active (measured active power), in which the offset active power Iofs_Active is offset from the injection active power Ix_Active, and a reactive power I_Reactive (measured reactive power), in which the offset reactive power Iofs_Reactive is offset from the injection reactive power Ix_Reactive. Here, the active power I_Active and the reactive power I_Reactive are obtained by the following equations (1) and (2).

$$I\_Active = Ix\_Active - Iofs\_Active \qquad (1)$$

$$I\_Reactive = Ix\_Reactive - Iofs\_Reactive \qquad (2)$$

The measurement apparatus 1 may calculate the voltage $V_M$ to be measured and the phase $\theta_M$ of the leakage current, using the active power I_Active and the reactive power I_Reactive calculated as described above. This allows the measurement apparatus 1 to acquire the voltage $V_M$ to be measured and the phase $\theta_M$ of the leakage current with higher accuracy, with reduced influences of measurement environment, internal leakages, and the like.

As described above, theoretically, only the leakage current $I_M$ of the voltage $V_M$ to be measured can be acquired by comparing the waveform of the voltage $V_2$ with the waveform of the voltage $V_1 (=V_t)$. In practice, however, there are leakages in the resistor 25 and the like, and a contribution of such leakages may cause errors in the measurement values. Therefore, the measurement apparatus 1 may measure, at the measurement terminal 37, the measurement signal $V_3$ of the operational amplifier 12 with the switch 21 connected to the operational amplifier 12 side and the switch 22 connected. The measurement apparatus 1 may directly measure the leakage current $I_M$ (current effective value: $I_M$) of the voltage $V_M$ to be measured, based on the voltage $V_3$. The measurement apparatus 1 may calculate the voltage $V_M$ to be measured, based on the active power I_Active, the reactive power I_Reactive, the current effective value $I_M$ of the leakage current $I_M$, the frequency $F_t$ of the voltage $V_t$ of the injection current, and the frequency $F_M$ of the voltage $V_M$ to be measured, in addition to the leakage current $I_M$ measured as described above. Thus, the measurement apparatus 1 can acquire the voltage $V_M$ to be measured with higher accuracy by provision of the measurement terminal 37 for directly measuring the leakage current $I_M$ and the switch 21 for connecting the clip electrode 40 to the measurement terminal 37. The relationship between the active power I_Active and reactive power I_Reactive and the aforementioned resistance component 87 and capacitance component 88 of the cable sheath 82 (including the insulator portion 401) will be described below.

Figure 5:
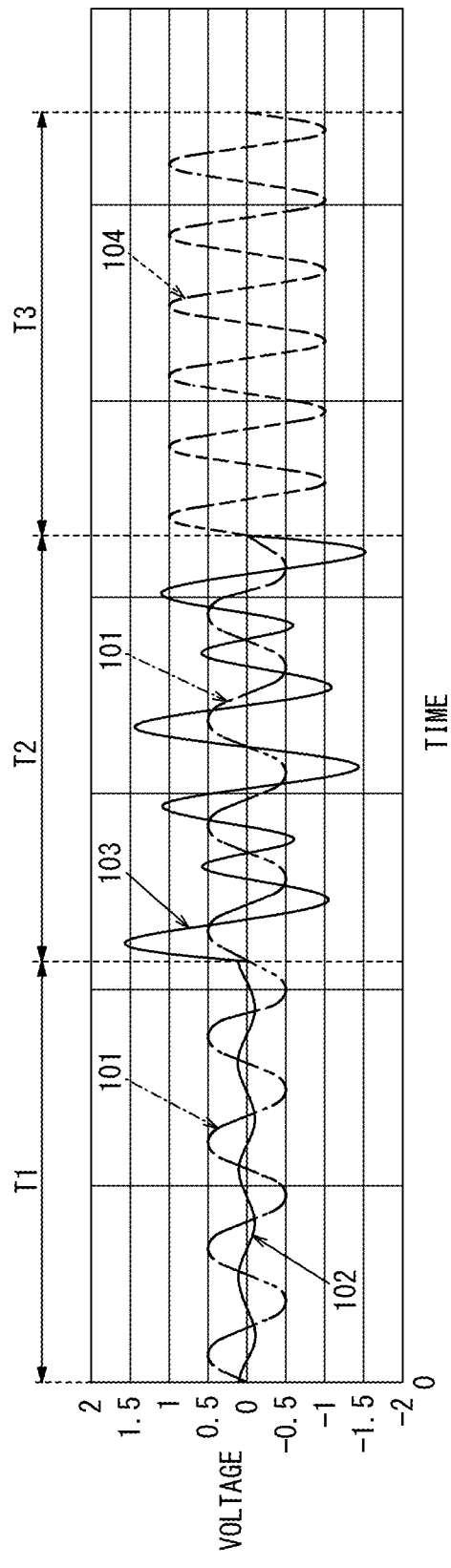
FIG. 5 is a diagram explaining an example of a measurement sequence by the measurement apparatus.

Concrete operations of the measurement apparatus 1 will be described with reference to FIG. 5. FIG. 5 is a diagram explaining an example of a measurement sequence by the measurement apparatus 1. In FIG. 5, the horizontal axis indicates time, and the vertical axis indicates voltage.

During a measurement period T1 (e.g., a duration of 100 ms), the measurement apparatus 1 calculates the offset active power Iofs_Active and the offset reactive power Iofs_Reactive in the circuit unit 71. Specifically, the measurement apparatus 1 opens the switch 22 and injects the injection current from the injection terminal 31. The measurement apparatus 1 acquires the measurement signal $V_1$ (=voltage $V_t$ of the injection current) measured at the measurement terminal 35 and the measurement signal $V_2$ measured at the measurement terminal 36. In FIG. 5, the graph 101 represents a variation of the voltage $V_1$ of the measurement signal $V_1$ with time. The graph 102 represents a variation of the voltage $V_2$ of the measurement signal $V_2$ with time. The measurement apparatus 1 acquires, as the offset active power Iofs_Active, the average of a multiplication of an instantaneous value of the voltage $V_1$ and an instantaneous value of the voltage $V_2$. The measurement apparatus 1 calculates, as the offset reactive power Iofs_Reactive, the average of a multiplication of an instantaneous value of the voltage $V_1$ with a phase shifted by 90 degrees and an instantaneous value of the voltage $V_2$. In other words, the offset active power Iofs_Active and the offset reactive power Iofs_Reactive are equivalent to an active power and a reactive power in the circuit unit 71 that are measured without a contribution of the leakage current from the core wire 81, to which the voltage $V_M$ to be measured is applied, with application of the injection current in the circuit unit 71.

During a measurement period T2 (e.g., a duration of 100 ms), the measurement apparatus 1 calculates the injection active power Ix_Active and the injection reactive power Ix_Reactive in the circuit unit 71. Specifically, the measurement apparatus 1 connects the switch 21 to the resistor 25 side and connects the switch 22, and injects the injection current from the injection terminal 31. The measurement apparatus 1 acquires the measurement signal $V_1$ (=voltage $V_t$ of the injection current) measured at the measurement terminal 35 and the measurement signal $V_2$ measured at the measurement terminal 36. Also in the measurement period T2 of FIG. 5, the graph 101 represents a variation of the voltage $V_1$ of the measurement signal $V_1$ with time. The graph 103 represents a variation of the voltage $V_2$ of the measurement signal $V_2$ with time. The measurement apparatus 1 acquires, as the injection active power Ix_Active, the average of a multiplication of an instantaneous value of the voltage $V_1$ and an instantaneous value of the voltage $V_2$. The measurement apparatus 1 calculates, as the injection reactive power Ix_Reactive, the average of a multiplication of an instantaneous value of the voltage $V_1$ with a phase shifted by 90 degrees and an instantaneous value of the voltage $V_2$. In other words, the injection active power Ix_Active and the injection reactive power Ix_Reactive are equivalent to an active power and a reactive power in the circuit unit 71 that are measured with a contribution of the leakage current $I_M$ from the core wire 81, to which the voltage $V_M$ to be measured is applied, with application of the injection current in the circuit unit 71.

During a measurement period T3 (e.g., a duration of 300 ms), the measurement apparatus 1 measures the leakage current $I_M$ of the voltage $V_M$ to be measured. Specifically, the measurement apparatus 1 connects the switch 21 to the operational amplifier 12 side and outputs the leakage current $I_M$ of the voltage $V_M$ to be measured to the operational amplifier 12. The operational amplifier 12 amplifies the leakage current $I_M$ and outputs the amplified leakage current $I_M$ to the measurement terminal 37. The measurement apparatus 1 acquires the measurement signal $V_3$ measured at the measurement terminal 37, which is a current corresponding to the leakage current $I_M$. In FIG. 5, a graph 104 represents a variation of the voltage $V_3$ of the measurement signal $V_3$ with time. The measurement apparatus 1 acquires the current effective value $I_M$ of the leakage current $I_M$ measured in this manner. In other words, the measurement apparatus 1 acquires the voltage $V_3$ of the leakage current $I_M$ of the voltage $V_M$ to be measured that has leaked out of the core wire 81 through the insulator (the cable sheath 82 and the insulator portion 401) without a contribution of the injection current, and acquires, based on the voltage $V_3$, the current effective value of the leakage current $I_M$.

The measurement apparatus 1 acquires the voltage $V_M$ to be measured and phase $\theta_M$ based on the information acquired in the measurement periods T1 to T3. First, the measurement apparatus 1 calculates the active power I_Active from the equation (1) based on the injection active power Ix_Active and the offset active power Iofs_Active acquired in the measurement periods T1 and T2. Similarly, the measurement apparatus 1 calculates the reactive power I_Reactive from the equation (2) based on the injection reactive power Ix_Reactive and the offset reactive power Iofs_Reactive acquired in the measurement periods T1 and T2.

The measurement apparatus 1 calculates the phase $\theta_M$ of the leakage current $I_M$ relative to the voltage $V_t$ of the injection current, based on the active power I_Active and the reactive power I_Reactive. Specifically, the measurement apparatus 1 may calculate the the phase $\theta_M$ of the leakage current $I_M$ using the following equation (3).

$$\theta_M = \arctan(I\_Reactive/I\_Active) \tag{3}$$

The measurement apparatus 1 acquires the voltage $V_M$ to be measured based on the active power I_Active, the reactive power I_Reactive, the voltage $V_t$ and frequency $F_t$ of the injection current, the frequency $F_M$ of the voltage $V_M$ to be measured, and the current effective value $I_M$ of the leakage current $I_M$.

Here, as expressed by the following equation (4), a value I_Reactive' is calculated by multiplying the reactive power I_Reactive by the ratio between the frequency $F_M$ of the voltage $V_M$ to be measured and the frequency $F_t$ of voltage $V_t$ of the injection current.

$$I\_Reactive' = I\_Reactive \times (F_M/F_t) \tag{4}$$

In this case, an apparent power I_Apparent is calculated by the following equation (5).

$$I\_Apparent = \left( (I\_Active)^2 + (I\_Reactive')^2 \right)^{1/2} / V_t \tag{5}$$

Here, $((I\_Active)^2 + (I\_Reactive')^2)^{1/2}$ corresponds to the apparent power.

Therefore, the measurement apparatus 1 calculates the apparent power I_Apparent by the equation (5), and then calculates the voltage $V_M$ to be measured by the following equation (6).

$$V_M = I_M/I\_Apparent \times V_t \tag{6}$$

When the switch 21 is connected to the resistor 25 side, the switch 22 is connected, and the injection current is injected from the injection terminal 31, currents $I_R$ and $I_C$ flowing through the resistance component 87 and the capacitance component 88 of the cable sheath 82 (including the insulator portion 401) are represented by the following equations (7) and (8).

$$I_R = I\_Active/R_x \tag{7}$$

$$I_C = I\_Reactive/R_x \tag{8}$$

Then, the resistance value $R_I$ of the resistance component 87 of the cable sheath 82 (including the insulator portion 401) and the capacitance value $C_I$ of the capacitance component 88 thereof are represented by the following equations (9) and (10).

$$R_I = V_t/I_R \tag{9}$$

$$C_I = V_t/I_C \tag{10}$$

Therefore, the calculations in the equations (4) to (6) correspond to calculating the voltage $V_M$ to be measured by back-calculating the voltage level 15 of the measurement signal $V_3$ from the resistance component 87 and the capacitance component 88, which are obtained from the measurement signals $V_1$ and $V_2$.

The measurement apparatus 1 outputs the voltage $V_M$ to be measured and the phase $\theta_M$ of the leakage current obtained as described above. For example, the measurement apparatus 1 may display the voltage $V_M$ and the phase $\theta_M$ on the output interface 724 or store the voltage $V_M$ and the phase $\theta_M$ in the memory 722.

As described above, the measurement apparatus 1 injects the injection current into the cable 80 to which the voltage $V_M$ to be measured is applied, and measures the composite current (voltage $V_2$), which is a combination of the injection current and the leakage current $I_M$ of the voltage $V_M$ to be measured that has leaked out through the cable sheath 82. The measurement apparatus 1 calculates the active power (measured active power) and the reactive power (measured reactive power) based on a contribution of the voltage $V_M$ to be measured, by analyzing the injection current (voltage $V_1 = V_t$) and the composite current (voltage $V_2$). The measurement apparatus 1 acquires the phase $\theta_M$ of the voltage $V_M$ to be measured, relative to the voltage $V_t$ of the injection current, using the ratio between the reactive power and the active power. The measurement apparatus 1 also calculates the apparent power I_Apparent, based on the reactive power and active power, the ratio between the frequency $F_M$ of the voltage $V_M$ to be measured and the frequency $F_t$ of the voltage $V_t$ of the injection current, and the voltage $V_t$ of the injection current. The measurement apparatus 1 calculates the voltage $V_M$ to be measured from the leakage current $I_M$, the apparent power I_Apparent, and the voltage $V_t$ of the injection current. Thus, the measurement apparatus 1 injects, into the cable sheath 82, the injection current with the frequency $F_t$ different from the frequency $F_M$ of the voltage $V_M$ to be measured. Therefore, the measurement apparatus 1 can measure the voltage $V_M$ to be measured and the phase $\theta_M$ from over the cable sheath 82 with the simple configuration by distinguishing, based on the frequencies, the voltage $V_M$ to be measured from the voltage $V_t$ of the injection current, while the cable is in a live wire condition.

The measurement apparatus 1 also measures the offset active power Iofs_Active and the offset reactive power Iofs_Reactive with the switch 22 disconnected, corrects the injection active power Ix_Active and the injection reactive power Ix_Reactive, and then calculates the voltage $V_M$ to be measured and the phase $\theta_M$. The offset active power Iofs_Active and the offset reactive power Iofs_Reactive reflect a power consumed by the capacitance component and the insulation resistance component in the circuit unit 71. Therefore, the measurement apparatus 1 can measure the voltage $V_M$ to be measured and the phase $\theta_M$ with higher accuracy by excluding the influences of leakages, environment, and the like in the circuit unit 71.

The measurement apparatus 1 directly measures the leakage current $I_M$ of the voltage $V_M$ to be measured by switching the switch 21, and measures the voltage $V_M$ to be measured based on the measurement value. Therefore, the measurement apparatus 1 can measure the voltage $V_M$ to be measured and the phase $\theta_M$ with higher accuracy by excluding the influences of resistance leakages and the like in the circuit unit 71.

FIG. 5 illustrates an example in which the offset active power Iofs_Active and the offset reactive power Iofs_Reactive are calculated in the measurement period T1, then the injection active power Ix_Active and the injection reactive power Ix_Reactive are calculated in the measurement period T2, and then the leakage current $I_M$ is measured in the measurement period T3. However, the measurement sequence is arbitrary and is not limited to that illustrated in FIG. 5.

The measurement apparatus 1 described with reference to FIGS. 1 to 5 may be applied, for example, to an apparatus that measures the amount of electricity in a three-wire power transmission circuit.

Figure 6:
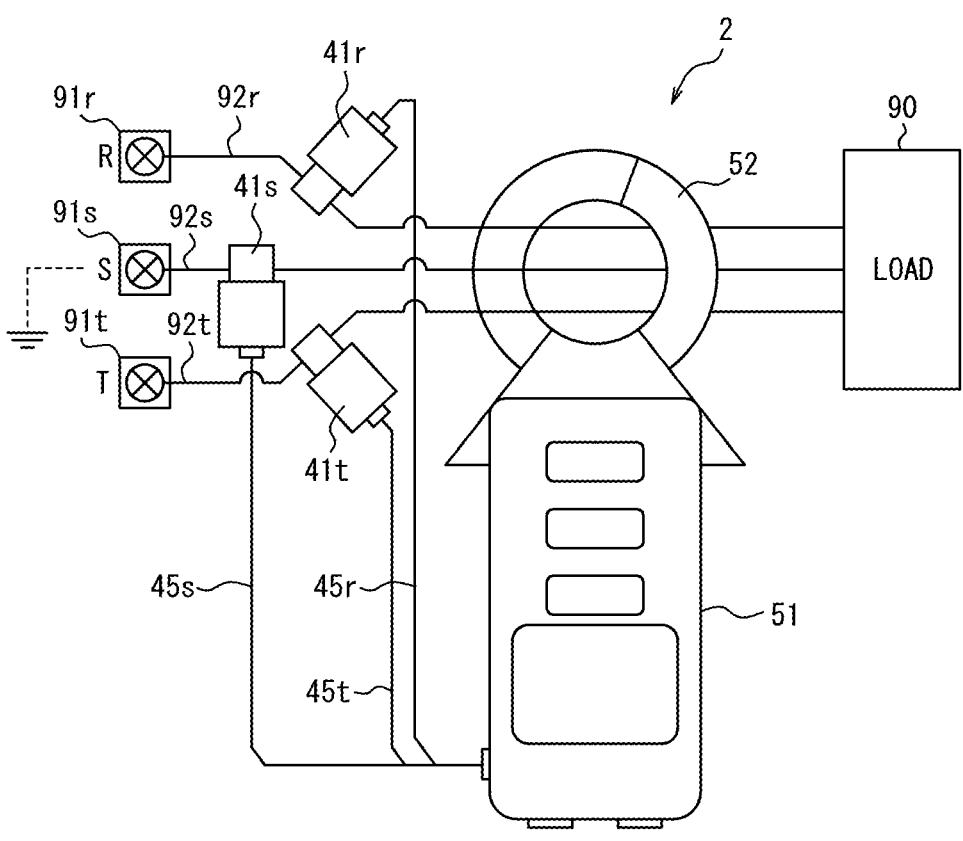
FIG. 6 is a diagram illustrating an example of an apparatus that measures a live wire insulation resistance, to which the measurement apparatus of FIG. 1 is applied.

FIG. 6 is a diagram illustrating an example of an apparatus 2 that measures a live wire insulation resistance, to which the measurement apparatus 1 of FIG. 1 is applied. The apparatus 2 is an example of a configuration in which the measurement apparatus 1 according to this embodiment is applied to a clamp sensor. The clamp sensor is an apparatus that measures, using electromagnetic induction action, a voltage to be measured based on a measurement value of a magnetic field generated in a magnetic core located around conductors. The apparatus 2 includes a main body 51, a clamp 52, insulation clips 41 (41r, 41s, 41t), and wiring 45 (45r, 45s, 45t). The apparatus 2 has the same configuration as the insulation clip 41 and the wiring 45 described with reference to FIGS. 2 and 3 for each of R, S, and T. The main body 51 has the same configuration as the apparatus main body 10 described with reference to FIG. 4 for each of R, S, and T. The main body 51 also has a configuration for measuring a current detected at the clamp 52 by electromagnetic induction action.

In FIG. 6, a power is supplied from terminals 91 (91r, 91s, 91t) to a load 90 through three-phase three-wire cables 92 (92r, 92s, 92t). In the example of FIG. 6, the clamp 52 is used, for example, to measure a leakage current in a switchboard circuit. The apparatus 2 can measure a voltage to be measured applied to each cable 92 and a phase thereof in a non-contact manner, by clipping the cables 92 (92r, 92s, 92t) with the insulation clips 41 (41r, 41s, 41t), respectively.

The apparatus 2 constitutes a live wire insulation resistance Ior measurement device with such a non-contact voltage probe configuration. That is, a leakage current Io measured at the clamp 52 is a composite value of a capacitive leakage and a resistive leakage. Therefore, the apparatus 2 can extract only the resistive leakage from the difference between the phase of the voltage to be measured that has been measured by the insulation clip 41 and the phase of the current Io that has been measured by the clamp 52. The apparatus 2 can also obtain the value of the insulation resistance from the value of the voltage to be measured that has been measured by the insulation clip 41 and the leakage current of the resistance component of Io measured by the clamp 52. Since the apparatus 2 can make these measurements in a non-contact manner without directly touching live wires, an operator can work safely in hazardous switchboard operations.

Figure 7:
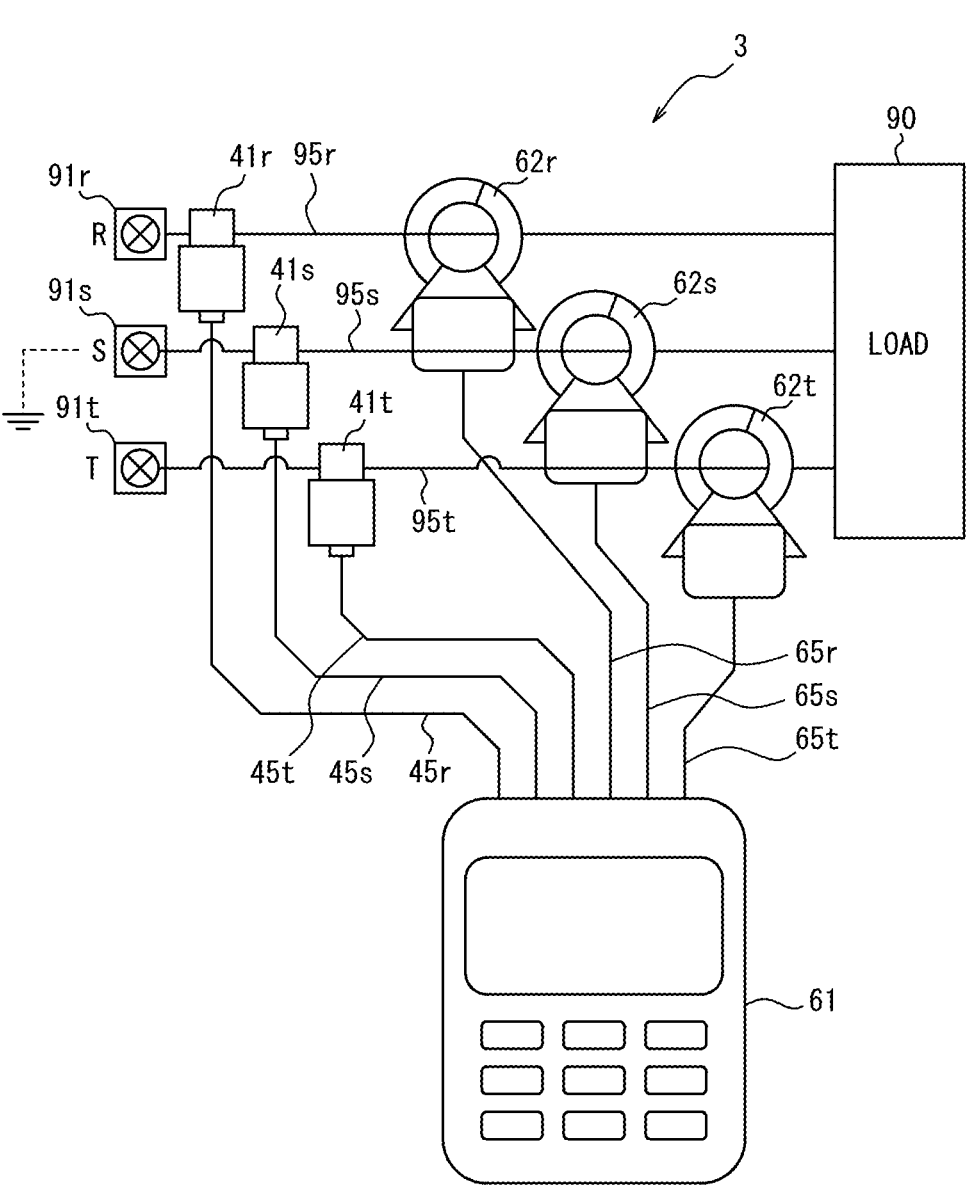
FIG. 7 is a diagram illustrating an example of a wattmeter to which the measurement apparatus of FIG. 1 is applied.

FIG. 7 is a diagram illustrating an example of a wattmeter 3 to which the measurement apparatus 1 of FIG. 1 is applied. The wattmeter 3 includes a main body 61, clamps 62 (62r, 62s, 62t), wiring 65 (65r, 65s, 65t), insulation clips 41 (41r, 41s, 41t), and wiring 45 (45r, 45s, 45t). The wattmeter 3 in FIG. 7 differs from the apparatus 2 in FIG. 6 in that the wattmeter 3 has not only the insulation clips 41 and the wiring 45, but also the clamps 62 and the wiring 65 for each of R, S, and T. According to the wattmeter 3 as illustrated in FIG. 7, a clamped wattmeter or a direct current-measuring wattmeter can measure phases and voltages in a non-contact manner, in addition to a load current measurement and a power measurement. Since the wattmeter 3 can also make these measurements without contact to live wires, an operator can work safely in hazardous switchboard operations.

As described above, the measurement apparatus 1 can be applied to wattmeters, voltmeters, and the like, in addition to live wire insulation measurements. For example, the measurement apparatus 1 can be applied to voltage measurements in hazardous locations and devices for safely measuring voltage in outdoor high-voltage facilities and the like, such as digital multimeters and electric meters.

As described above, the measurement apparatus 1 can identify the resistance component 87 and the capacitance component 88 of the cable sheath 82 in a live wire condition, with the resistance component 87 and the capacitance component 88 distinguished from the signals to be measured, by injecting the injection current with the frequency $F_t$ different from the frequency $F_M$ of the voltage $V_M$ to be measured. The measurement apparatus 1 can also measure the voltage $V_M$ to be measured and the phase $\theta_M$, based on the signals acquired through the cable sheath 82 and the insulator portion 401 by clipping the insulation clip 41 from over the cable sheath 82. Thus, the operator can safely proceed with maintenance work without clipping live wires.

The measurement apparatus 1 has a simple circuit configuration as illustrated in FIG. 4. Therefore, the measurement apparatus 1 can be realized with a relatively inexpensive configuration.

The present disclosure is not limited to the embodiment described above. For example, a plurality of blocks described in the block diagrams may be integrated, or one block may be divided. Other changes are possible to the extent of not departing from the intent of the present disclosure.

The invention claimed is:

1. A measurement apparatus comprising a controller configured to:

inject an injection current with a second frequency into a core wire through an insulator, a voltage to be measured, with a first frequency, being applied to the core wire;

acquire a composite current that is composed of the injection current and a leakage current of the voltage to be measured having leaked through the insulator;

calculate a measured active power and a measured reactive power based on the composite current, the measured active power and the measured reactive power being equivalent to an active power and a reactive power based on a contribution of the voltage to be measured;

calculate the voltage to be measured, based on the measured active power, the measured reactive power, the first frequency, the second frequency, a voltage of the injection current, and a current effective value of the leakage current; and output the voltage to be measured.

2. The measurement apparatus according to claim 1, wherein the controller is configured to:

calculate an apparent power based on the measured active power, the measured reactive power, the first frequency, and the second frequency, the apparent power corresponding to the measured active power and the measured reactive power; and calculate the voltage to be measured, based on the calculated apparent power, the voltage of the injection current, and the current effective value of the leakage current.

3. The measurement apparatus according to claim 1, wherein the controller is configured to:

calculate a phase of the leakage current, relative to the injection current, based on a ratio between the calculated measured active power and the calculated measured reactive power; and further output the calculated phase of the leakage current.

4. The measurement apparatus according to claim 1, wherein the controller is configured to:

measure an injection active power and an injection reactive power equivalent to an active power and a reactive power in a circuit unit that are measured with a contribution of the leakage current with application of the injection current in the circuit unit;

measure an offset active power and an offset reactive power equivalent to an active power and a reactive power in the circuit unit that are measured without a contribution of the leakage current with application of the injection current in the circuit unit;

calculate, as the measured active power, a power in which the offset active power is offset from the injection active power; and calculate, as the measured reactive power, a power in which the offset reactive power is offset from the injection reactive power.

5. The measurement apparatus according to claim 1, wherein the controller is configured to:

acquire a voltage of the leakage current of the voltage to be measured that has leaked out of the core wire through the insulator without a contribution of the injection current; and acquire the current effective value of the leakage current, based on the acquired voltage of the leakage current.

6. A measurement method by a measurement apparatus including a controller, the measurement method comprising:

injecting, by the controller, an injection current with a second frequency into a core wire through an insulator, a voltage to be measured, with a first frequency, being applied to the core wire;

acquiring, by the controller, a composite current that is composed of the injection current and a leakage current of the voltage to be measured having leaked through the insulator;

calculating, by the controller, a measured active power and a measured reactive power based on the composite current, the measured active power and the measured reactive power being equivalent to an active power and a reactive power based on a contribution of the voltage to be measured;

calculating, by the controller, the voltage to be measured, based on the measured active power, the measured reactive power, the first frequency, the second frequency, a voltage of the injection current, and a current effective value of the leakage current; and outputting, by the controller, the voltage to be measured.

7. The measurement method according to claim 6, comprising:

calculating, by the controller, an apparent power based on the measured active power, the measured reactive power, the first frequency, and the second frequency, the apparent power corresponding to the measured active power and the measured reactive power; and calculating, by the controller, the voltage to be measured, based on the calculated apparent power, the voltage of the injection current, and the current effective value of the leakage current.

8. The measurement method according to claim 6, comprising:

calculating, by the controller, a phase of the leakage current, relative to the injection current, based on a ratio between the calculated measured active power and the calculated measured reactive power; and further outputting, by the controller, the calculated phase of the leakage current.

9. The measurement method according to claim 6, comprising:

measuring, by the controller, an injection active power and an injection reactive power equivalent to an active power and a reactive power in a circuit unit that are measured with a contribution of the leakage current with application of the injection current in the circuit unit;

measuring, by the controller, an offset active power and an offset reactive power equivalent to an active power and a reactive power in the circuit unit that are measured without a contribution of the leakage current with application of the injection current in the circuit unit;

calculating, by the controller, as the measured active power, a power in which the offset active power is offset from the injection active power; and calculating, by the controller, as the measured reactive power, a power in which the offset reactive power is offset from the injection reactive power.

10. The measurement method according to claim 6, comprising:

acquiring, by the controller, a voltage of the leakage current of the voltage to be measured that has leaked out of the core wire through the insulator without a contribution of the injection current; and acquiring, by the controller, the current effective value of the leakage current, based on the acquired voltage of the leakage current.

\* \* \* \* \*